United States Patent
Chen et al.

(10) Patent No.: US 10,908,113 B2
(45) Date of Patent: Feb. 2, 2021

(54) LIQUID-SENSING APPARATUS AND METHOD OF MANUFACTURING THE SAME

(71) Applicant: Industrial Technology Research Institute, Hsinchu (TW)

(72) Inventors: Jui-Chin Chen, Hsinchu County (TW); Wen Wang, New Taipei (TW); Pei-Jer Tzeng, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 205 days.

(21) Appl. No.: 16/197,372

(22) Filed: Nov. 21, 2018

(65) Prior Publication Data

US 2020/0103367 A1    Apr. 2, 2020

(30) Foreign Application Priority Data

Oct. 1, 2018 (TW) .............................. 107134668 A

(51) Int. Cl.
  *G01N 27/40*    (2006.01)
  *G01N 27/30*    (2006.01)
  (Continued)

(52) U.S. Cl.
  CPC ............. *G01N 27/40* (2013.01); *G01N 27/30* (2013.01); *G01N 27/4078* (2013.01);
  (Continued)

(58) Field of Classification Search
  CPC .. G01N 27/40; G01N 27/413; G01N 27/4166; G01N 27/4168
  See application file for complete search history.

(56) References Cited

U.S. PATENT DOCUMENTS 6,838,297 B2    1/2005  Iwasaki et al.
7,155,959 B2    1/2007  Su et al.
(Continued)

FOREIGN PATENT DOCUMENTS

CN    102692430    9/2012
JP    2011112642    6/2011
(Continued)

OTHER PUBLICATIONS

Singh, Manju et al. "Highly ordered anodic porous alumina membrane and its surface modification approaches for biomedical application"IOSR Journal of Applied Chemistry e-ISSN: 2278-5736. vol. 7, Issue 1, Ver. 1 (Feb. 2014), pp. 17-34. (Year: 2014).*
(Continued)

*Primary Examiner* — Paul M. West
(74) *Attorney, Agent, or Firm* — JCIPRNET

(57) ABSTRACT

A liquid-sensing apparatus includes a substrate, partitions, and independent sensors. The partitions are disposed on the substrate for separating several housing spaces in order to respectively house a to-be-detected liquid, wherein each of the housing spaces has a bottom, a closed sidewall, and an open top, and thus the to-be-detected liquid may be dripped from the top of the housing space. The independent sensors are respectively formed at the bottom of different housing spaces, wherein the independent sensors respectively include different sensing material layers, and surfaces of the different sensing material layers have nanoholes.

15 Claims, 6 Drawing Sheets

(51) Int. Cl.
*G01N 27/416* (2006.01)
*G01N 27/413* (2006.01)
*G01N 27/407* (2006.01)
*H01L 21/3213* (2006.01)

(52) U.S. Cl.
CPC ....... *G01N 27/413* (2013.01); *G01N 27/4166* (2013.01); *G01N 27/4168* (2013.01); *H01L 21/32139* (2013.01)

(56) References Cited

U.S. PATENT DOCUMENTS

| | | | |
|---|---|---|---|
| 7,449,757 | B2 | 11/2008 | Bradley et al. |
| 8,281,642 | B2 | 10/2012 | Lee et al. |
| 9,127,304 | B2 | 9/2015 | Wei et al. |
| 9,506,891 | B2 | 11/2016 | Lebens et al. |
| 9,632,060 | B2 | 4/2017 | Shah et al. |
| 9,851,325 | B2 | 12/2017 | Kawde et al. |
| 9,943,256 | B2 | 4/2018 | Varsavsky et al. |
| 9,945,841 | B2 | 4/2018 | Choi et al. |
| 9,952,122 | B2 * | 4/2018 | Veiseh ................. G01N 21/253 |
| 2004/0040868 | A1 * | 3/2004 | DeNuzzio .......... G01N 21/0303 205/792 |
| 2008/0157354 | A1 | 7/2008 | Zhang et al. |
| 2010/0015656 | A1 * | 1/2010 | Seitz .................... C12M 41/34 435/29 |
| 2011/0021363 | A1 | 1/2011 | Gumbrecht et al. |
| 2011/0120866 | A1 | 5/2011 | Lee et al. |

FOREIGN PATENT DOCUMENTS

| | | |
|---|---|---|
| JP | 5027280 | 9/2012 |
| KR | 20110056694 | 5/2011 |
| KR | 101283685 | 7/2013 |
| TW | 200720646 | 1/2007 |
| TW | I428591 | 3/2014 |
| WO | 2008081998 | 7/2008 |

OTHER PUBLICATIONS

Kudr, Jiri et al. "Simultaneous Automatic Electrochemical Detection of Zinc, Cadmium, Copper and Lead Ions in Environmental Samples Using a Thin-Film Mercury Electrode and an Artificial Neural Network" Sensors 2015, 15, 592-610. Dec. 30, 2014. (Year: 2014).*
S. Sarkar, et al., "Unconventional Electrochemistry in Micro-/Nanofluidic Systems," Micromachines, vol. 7, May 2016, pp. 1-13.
Lu CC, et al., "A Macroporous $TiO_2$ Oxygen Sensor Fabricated Using Anodic Aluminium Oxide as an Etching Mask," Sensors, Jan. 2010, pp. 670-683.
Allen J. Bard, et al., "Kinetics of Electrode Reactions," Chapter 3 of Electrochemical Methods: Fundamentals and Applications, Dec. 2000, pp. 87-100.
D. Grieshaber, et al., "Electrochemical Biosensors—Sensor Principles and Architectures," Sensors, Mar. 2018, pp. 1400-1458.
J. Wang, et al., "Electrochemical Glucose Biosensors," Chem. Rev., Feb. 2008, pp. 814-825.
V. Rai, et al., "Electrochemical nanoporous alumina membrane-based label-free DNA biosensor for the detection of *Legionella* sp," Talanta, vol. 98, Jun. 2012, pp. 112-117.
Jun Wang, et al., "Microfabricated Electrochemical Cell-Based Biosensors for Analysis of Living Cells In Vitro," Biosensors, Apr. 2012, pp. 127-170.
Q. Ge, et al., "A novel and simple cell-based electrochemical biosensor for evaluating the antioxidant capacity of Lactobacillus plantarum strains isolated from Chinese dry-cured ham," Biosensors & Bioelectronics, Aug. 2017, pp. 555-563.
Kyun Tae Kim, et al., "Hydrogen Gas Sensor Using Pd Nanowires Electro-Deposited Into Anodized Alumina Template," IEEE Sensors Journal, vol. 6, Jun. 2006, pp. 509-513.
Jiwon Lee, et al., "A hydrogen gas sensor employing vertically aligned $TiO_2$ nanotube arrays prepared by template-assisted method," Sensors & Actuators: B. Chemical, Aug. 2011, pp. 1494-1498.
N.D. Hoa et al., "An ammonia gas sensor based on non-catalytically synthesized carbon nanotubes on an anodic aluminum oxide template," Sensors and Actuators B, Apr. 2007, pp. 447-454.
"Office Action of Taiwan Counterpart Application," dated Mar. 7, 2019, p. 1-p. 5.

* cited by examiner

LIQUID-SENSING APPARATUS AND METHOD OF MANUFACTURING THE SAME

CROSS-REFERENCE TO RELATED APPLICATION

This application claims the priority benefit of Taiwan application serial no. 107134668, filed on Oct. 1, 2018. The entirety of the above-mentioned patent application is hereby incorporated by reference herein and made a part of this specification.

TECHNICAL FIELD

The disclosure relates to a liquid-sensing apparatus and a method of manufacturing the same.

BACKGROUND

The current electronic products have been developed to be light, thin, short, and small. Similarly, the sensing device has also been developed to be miniaturized, and a small-sized sensing apparatus is expected to achieve similar or identical function and efficacy to a large sensing device.

However, the current liquid-sensing apparatus is limited by the manufacturing technique, and therefore the sensing efficiency cannot be maintained or improved while miniaturizing. As a result, a technique capable of miniaturizing the liquid-sensing apparatus or improving the sensing efficiency is needed.

SUMMARY

A liquid-sensing apparatus of the disclosure includes a substrate, partitions, and independent sensors. The partitions are disposed on the substrate for separating several housing spaces in order to respectively house a to-be-detected liquid, wherein each of the housing spaces has a bottom, a closed sidewall, and an open top, and thus the to-be-detected liquid may be dripped from the top of the housing space. The independent sensors are respectively formed at the bottom of different housing spaces, wherein the independent sensors respectively include different sensing material layers, and surfaces of the different sensing material layers have nanoholes.

A method of manufacturing a liquid-sensing apparatus of the disclosure includes the following steps. A substrate is provided. Different sensing materials are formed on different regions of the substrate. An anodized aluminum oxide (AAO) layer is formed on the substrate to cover the sensing materials. The sensing materials are etched by using the AAO layer as a mask to form different sensing material layers. The AAO layer is removed, wherein surfaces of the different sensing material layers have nanoholes. Then, partitions are formed on the substrate to separate independent housing spaces according to different regions, and each of the sensing material layers is correspondingly disposed in each of the housing spaces.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
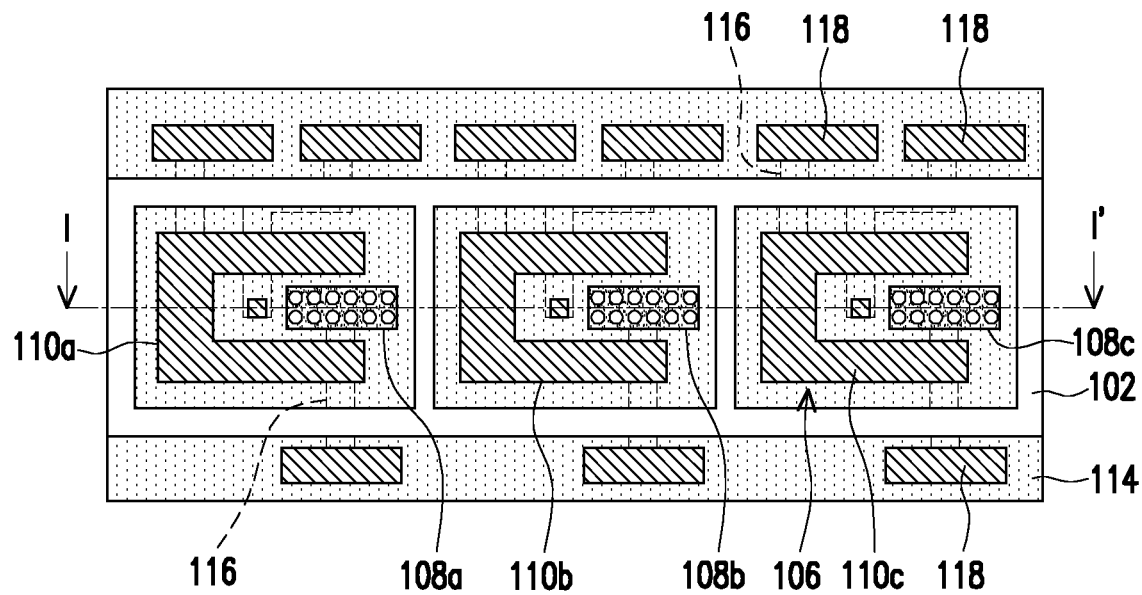
FIG. 1A is a top view of a liquid-sensing apparatus according to the first embodiment of the disclosure.

The disclosure is described below with reference to the drawings, but the disclosure may be implemented in many different forms and is not limited to the description of the embodiments. In the drawings, for clarity, the dimensions and relative dimensions of the various layers and regions may not be drawn to scale.

Figure 1B:
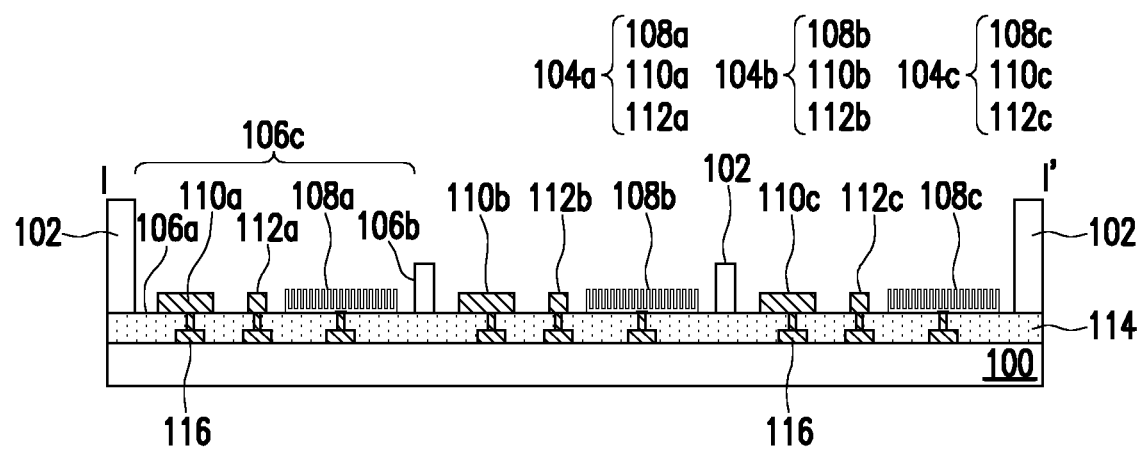
FIG. 1B is a cross section along line I-I' of FIG. 1A.

FIG. 1A is a top view of a liquid-sensing apparatus according to the first embodiment of the disclosure. FIG. 1B is a cross section along line I-I' of FIG. 1A.

Referring to FIG. 1A and FIG. 1B simultaneously, a liquid-sensing apparatus of the present embodiment substantially includes a substrate 100, partitions 102, and a plurality of independent sensors 104a, 104b, and 104c. The substrate 100 itself is not particularly limited and may be an insulating substrate, a conductor substrate, or a semiconductor substrate, such as a glass substrate, an aluminum nitride (AlN) substrate, a sapphire substrate, a gallium arsenide (GaAs) substrate, a silicon substrate, a polymer substrate, etc.; in the first embodiment, a semiconductor substrate is used as an example. The partitions 102 are disposed on the substrate 100 to form a plurality of housing spaces 106, wherein each of the housing spaces 106 has a bottom 106a, a closed sidewall 106b, and an open top 106c. The independent sensors 104a, 104b, and 104c are respectively formed at the bottoms 106a of the different housing spaces 106, wherein the independent sensors 104a, 104b, and 104c respectively include different sensing material layers 108a, 108b, and 108c. The materials of the sensing material layers 108a, 108b, and 108c each independently include a metal (such as titanium, vanadium, chromium, cobalt, nickel, copper, zinc, gallium, germanium, zirconium, niobium, molybdenum, technetium, ruthenium, rhodium, palladium, indium, tantalum, tungsten, platinum, gold, or other suitable metals), metal nitride (titanium nitride, tantalum nitride, tungsten nitride, or other suitable metal nitrides), metal sulfide (molybdenum sulfide or other suitable metal sulfides), or metal oxide (such as tin oxide, zinc oxide, copper oxide, indium gallium zinc oxide (IGZO), ruthenium dioxide ($RuO_2$), indium tin oxide (ITO), or other suitable metal oxides); however, the disclosure is not limited thereto, and any material capable of sensing a liquid may be applied thereto. Since an anodized aluminum oxide (AAO) layer may be utilized as an etching mask for forming the sensing material layers 108a, 108b, and 108c, the surfaces of the etched sensing material layers 108a, 108b, and 108c may have nanoholes, and the size of these nanoholes may be controlled to within a certain range, such as 100 nm or less, and therefore the sensing material layers 108a, 108b, and 108c have a controllable specific surface area, and thus the to-be-detected object may be quantified.

Referring further to FIG. 1A and FIG. 1B, the independent sensor 104a of the present embodiment further includes a counter electrode 110a and a reference electrode 112a, wherein the area of the counter electrode 110a is greater than the area of the sensing material layer 108a. Similarly, the independent sensor 104b may also include a counter electrode 110b and a reference electrode 112b, wherein the area of the counter electrode 110b is greater than the area of the sensing material layer 108b; and the independent sensor 104c further includes a counter electrode 110c and a reference electrode 112c, wherein the area of the counter electrode 110c is greater than the area of the sensing material layer 108c. The independent sensors 104a, 104b, and 104c are devices that may perform sensing via cyclic voltammetry measurements, an open-circuit potential method, electrochemical impedance spectroscopy measurements, a TAFEL method, or other suitable electrochemical measurement methods, wherein the function of the counter electrodes 110a to c is to complete the circuit, allowing electrons to flow through the sensing material layers 108a to c used as working electrodes. The reference electrodes 112a to c have a stable potential used as the reference value of the working electrodes, and the value obtained by the reference electrodes 112a to c is independent of the type and concentration of the to-be-detected liquid. In an embodiment, the material of the counter electrodes 110a to c may include, but is not limited to, gold, platinum, palladium, carbon, stainless steel, alloys thereof, or composites thereof; and the material of the reference electrodes 112a to c may include, but is not limited to, silver-silver chloride electrode, copper-copper chloride, carbon, gold, or platinum. However, the disclosure is not limited thereto, and if the sensing is performed using other methods, then the counter electrodes and/or the reference electrodes may be omitted.

In the first embodiment, an insulating layer 114 may be further included between the substrate 100 and the independent sensors 104a, 104b, and 104c, and a plurality of circuit layers 116 are disposed in the insulating layer 114 to be respectively electrically connected to each of the independent sensors 104a, 104b, and 104c. Moreover, although not specifically indicated in FIG. 1A and FIG. 1B, the circuit layers 116 may include a circuit connected to measurement pads 118 outside the partitions 102 from each electrode (working electrode, counter electrode, and reference electrode) and a via connected to each electrode (working electrode, counter electrode, and reference electrode). In an embodiment, the material of the insulating layer 114 may include, but is not limited to, silicon dioxide ($SiO_2$), silicon carbide (SiC), aluminum oxide ($Al_2O_3$), magnesium oxide (MgO), silicon nitride ($Si_3N_4$), glass, or other suitable insulating materials, and the material of the circuit layer 116 may include, but is not limited to, for example, copper, aluminum, silver, gold, platinum, nickel, chromium, or alloys thereof.

Figure 2:
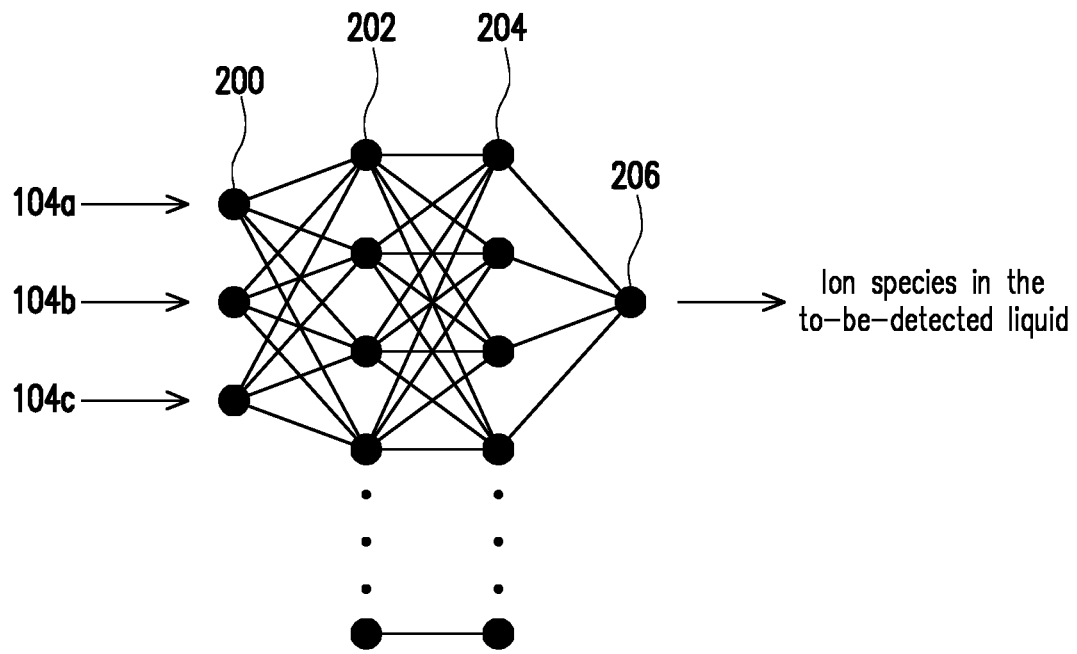
FIG. 2 is a neural network model of the liquid-sensing apparatus of the first embodiment.

In addition, the liquid-sensing apparatus of the first embodiment may also be used with the neural network of FIG. 2 to sort, classify, and input the current signal data obtained by each of the independent sensors 104a, 104b, and 104c into a neural network system to build models of different types of liquids. For example, the current or voltage signal measured by the independent sensors (104a, 104b, and 104c) is used as the input, and the ion species in the to-be-detected liquid is used as the output to build a neural network including one input layer 200, two hidden layers 202 and 204, and one output layer 206 as shown in FIG. 2, such that the liquid sensing apparatus of the present embodiment may achieve the classification of ion species in the to-be-detected liquid.

Figure 3:
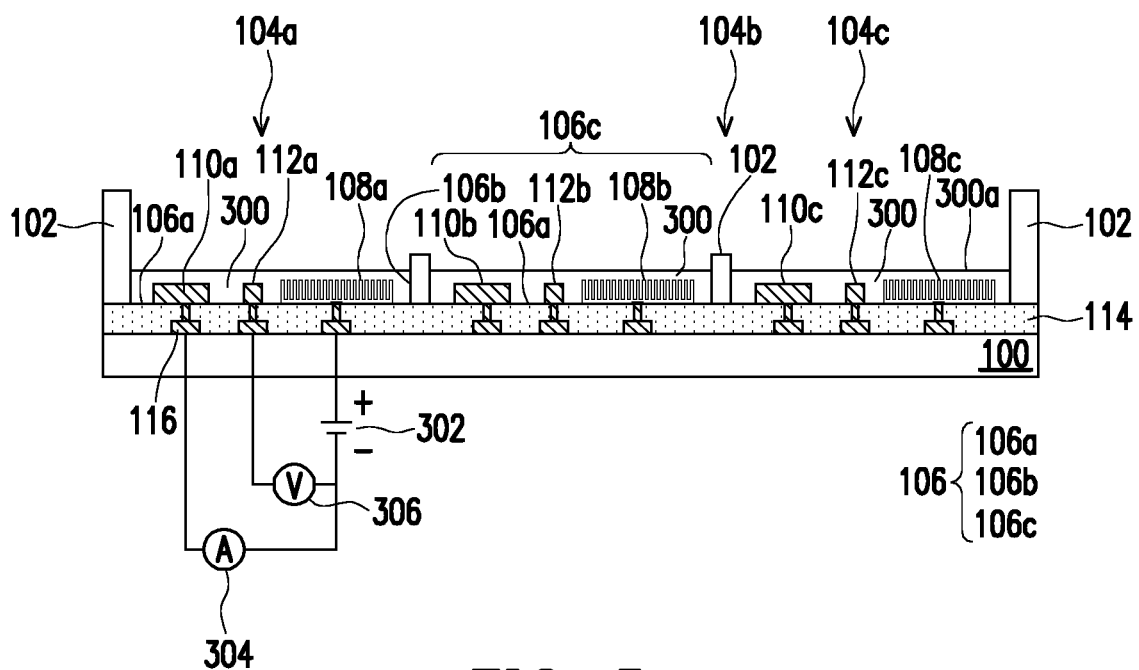
FIG. 3 is a cross section of the liquid-sensing apparatus of the first embodiment during sensing.

FIG. 3 is a cross section of the liquid-sensing apparatus of the first embodiment during sensing.

In FIG. 3, the adjacent independent sensors 104a and 104b have the sensing material layers 108a and 108b of different materials; and the adjacent independent sensors 104b and 104c have the sensing material layers 108b and 108c of different materials. A to-be-detected liquid 300 may be dripped from the tops 106c of the housing spaces 106, and the to-be-detected liquid 300 in each of the independent sensors 104a, 104b, and 104c is separated by the partitions 102 to avoid affecting the sensing sensitivity of the sensing material layers (108a, 108b, and 108c) of different materials, and therefore the height of the partitions 102 can be greater than a liquid surface 300a of the to-be-detected liquid 300. In FIG. 3, the peripheral partition 102 is higher and the internal partition 102 is lower. Therefore, before sensing, the to-be-detected liquid 300 may be entirely dripped, and then the to-be-detected liquid 300 may be evenly distributed in the housing space 106 of each of the independent sensors 104a to c by slightly shaking the liquid-sensing apparatus. However, the disclosure is not limited thereto, and the height and width of the partitions 102 may be varied as needed, such as by widening the width of the partitions 102 to the width of one housing space 106, so that the miniaturized independent sensors 104a to c may be clearly separated to implement independent sensing.

Referring further to FIG. 3, the liquid-sensing apparatus may further include a power supply 302, an ammeter 304, and a voltmeter 306, wherein the power supply 302 is coupled to the counter electrode 110a/reference electrode 112a and the sensing material layer 108a to apply a voltage to the working electrode (i.e., the sensing material layer 108a), the counter electrode 110a, and/or the reference electrode 112a. When the sensing material layer 108a is maintained at an appropriate electrochemical potential, the to-be-detected liquid 300 is changed, and the ammeter 304 coupled to the sensing material layer 108a and the counter electrode 110a may be used to measure the current between the sensing material layer 108a and the counter electrode 110a. The voltmeter 306 is used to measure the voltage difference between the reference electrode 112a and the sensing material layer 108a. Although the power supply 302, the ammeter 304, and the voltmeter 306 coupled to the independent sensor 104a are shown in FIG. 3, it should be understood that the other independent sensors 104b and 104c also have the same circuit configuration.

Figure 4:
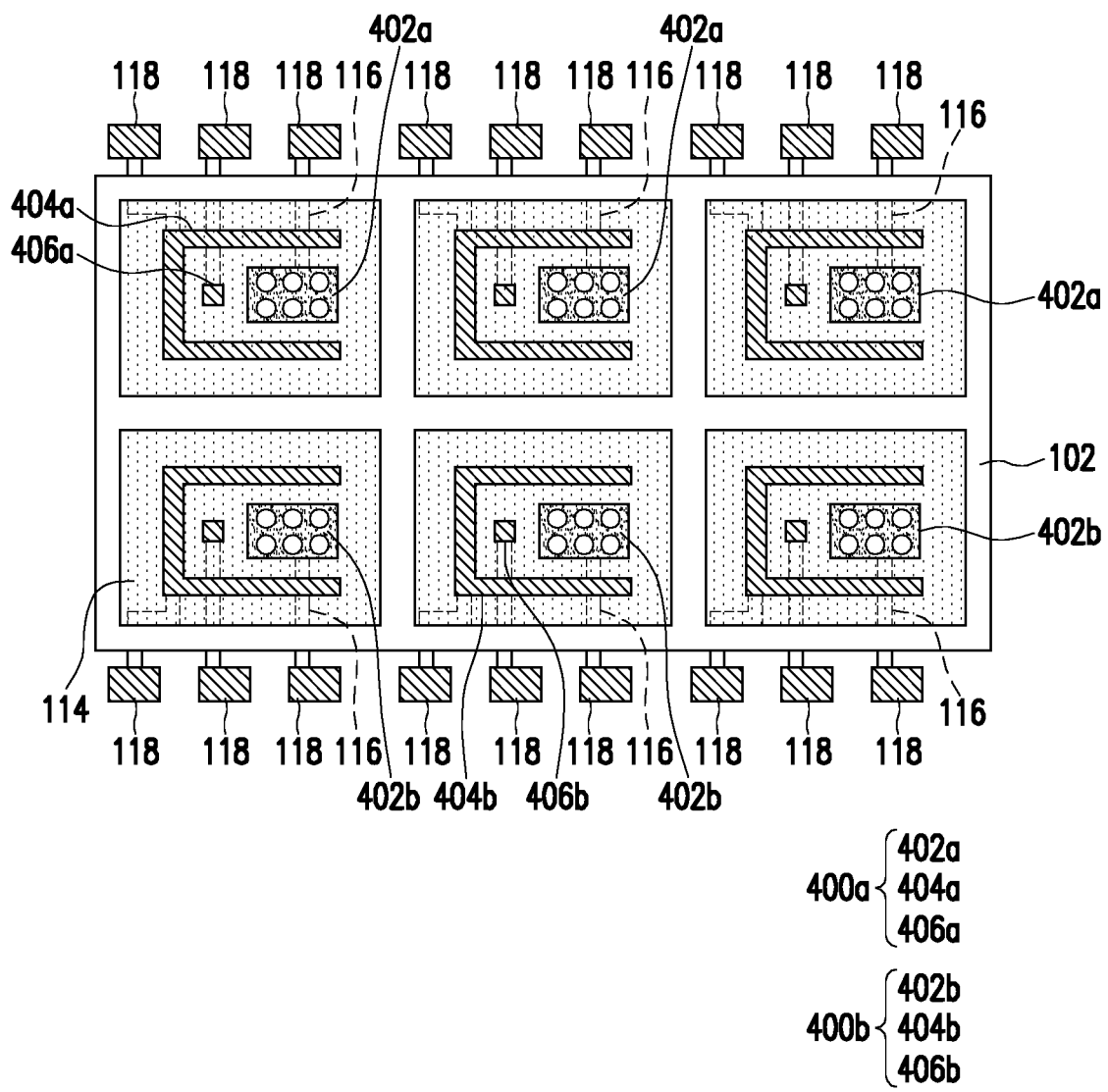
FIG. 4 is a top view of a liquid-sensing apparatus according to the second embodiment of the disclosure.

FIG. 4 is a top view of a liquid-sensing apparatus according to the second embodiment of the disclosure, and the same reference numerals as FIG. 1A are used in FIG. 4 to denote the same or similar elements, and the emitted technical descriptions such as the content on the material and function of each part are provided in the description for FIG. 1A and are not repeated herein.

In FIG. 4, three independent sensors 400a and three independent sensors 400b are arranged in an array, wherein the three independent sensors 400a disposed in the same row have a sensing material layer 402a of the same material, and the three independent sensors 400b disposed in the same row have a sensing material layer 402b of the same material; that is, the independent sensors 400a and 400b disposed in different rows have the sensing material layers 402a and 402b of different materials. According to the entire row of the independent sensors 400a and 400b of the same sensing material, different types of electrical analysis may be performed simultaneously on the to-be-detected object. For example, cyclic voltammetry may be used to obtain the oxidation-reduction potential and the solution reaction amount, the open circuit potential may be used to monitor the change in potential with time, and the polarization curve shows the amount of electrode reaction. Hence, the type and reaction concentration of the to-be-detected object may be inferred by the different electrical performances of the to-be-detected object.

The disclosure provides a liquid-sensing apparatus that is capable of increasing reaction area and has the function of classifying the to-be-detected liquid.

FIG. 5A to FIG. 5F are cross sections of a manufacturing process of a liquid-sensing apparatus according to the third embodiment of the disclosure.

Figure 5A:
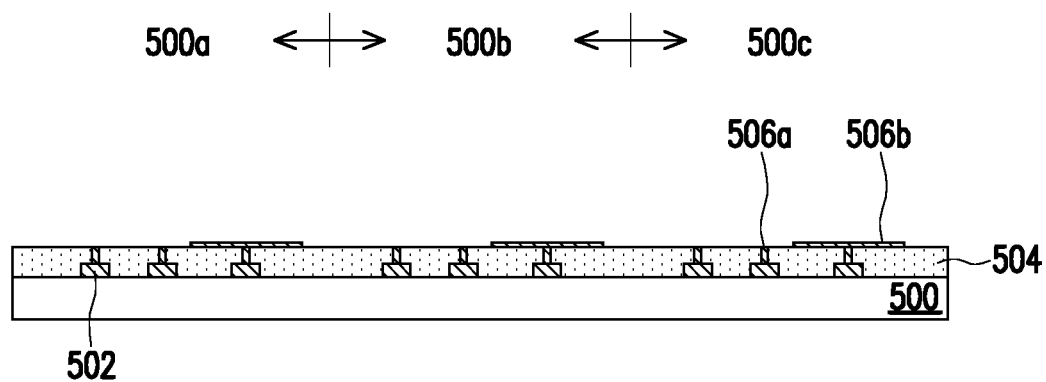
FIG. 5A to FIG. 5F are cross sections of a manufacturing process of a liquid-sensing apparatus according to the third embodiment of the disclosure.

Referring to FIG. 5A, a substrate 500 is provided, and the material selection of the substrate 500 is provided in the first embodiment and is therefore not repeated herein. Moreover, if the substrate 500 is an insulating substrate, then a plurality of circuit layers 502 may be first formed on the substrate 500 by a thin film deposition followed by a photolithography and etching process, and then an insulating layer 504 may be formed on the substrate 500 to cover the circuit layers 502. Then, via holes exposing a portion of the circuit layers 502 are first formed in the insulating layer 504 using a photolithography and etching process, and then a metal layer (not shown) is formed in the via holes and on the entire surface of the insulating layer 504 using a thin film deposition process. Then, vias 506a connected to the circuit layers 502 and metal underpads 506b connected to each of the vias 506a are simultaneously formed using a photolithography and etching process, and the positions of the metal underpads 506b are positions where the sensing material layers are to be formed. In another embodiment, the vias 506a and the metal underpads 506b may be formed using different steps, such that the material of the vias 506a and the material of the metal underpads 506b may be the same or different. The material selection of the circuit layers 502, the vias 506a, and the metal underpads 506b is provided for the circuit layers 116 of the first embodiment, and therefore is not repeated herein.

Figure 5B:
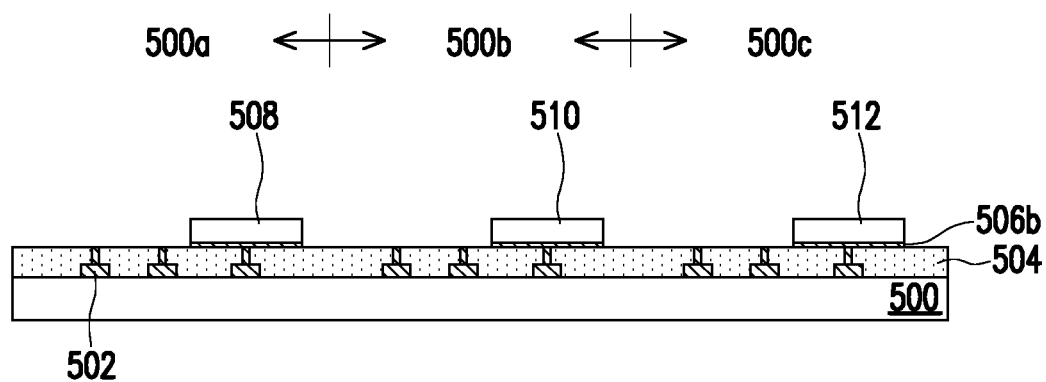

Then, referring to FIG. 5B, different sensing materials 508, 510, and 512 are formed on different regions 500a, 500b, and 500c of the substrate 500. The method of forming the sensing materials 508, 510, and 512 includes performing, for example, a thin film deposition process with a shadow mask, a lift-off process, or a photolithography and etching process after a thin film deposition, so as to form the sensing materials 508, 510, and 512 on the surfaces of the metal underpads 506b. Moreover, depending on the type of the sensing materials 508, 510, and 512, the number of times the above processes are performed may be changed. For example, if the three sensing materials 508, 510, and 512 are different materials from one another, then a thin film deposition process with a shadow mask, a lift-off process, or a photolithography and etching process after a thin film deposition may be performed three times for each region; and if the sensing materials 508 and 512 are the same material and the sensing material 510 is different from the other two, then a thin film deposition process with a shadow mask, a lift-off process, or a photolithography and etching process after a thin film deposition may be performed twice. The material selection of the sensing materials 508, 510, and 512 is provided in the first embodiment and is therefore not repeated herein.

Figure 5C:
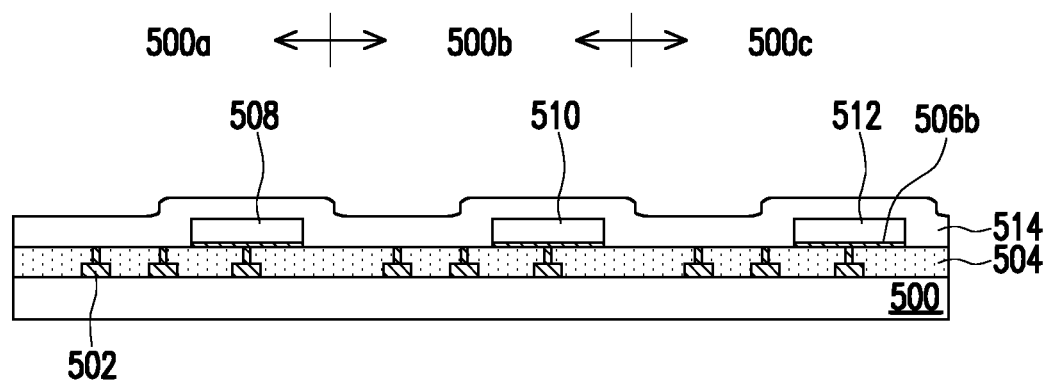

Next, referring to FIG. 5C, an anodized aluminum oxide (AAO) layer 514 is formed on the substrate to cover the sensing materials 508, 510, and 512. In an embodiment, the steps of forming the AAO layer 514 include first forming an aluminum layer (not shown) on the substrate 500, and then anodizing using sulfuric acid, phosphoric acid, or oxalic acid to form the AAO layer 514 having nanoholes (not shown). In other words, the AAO layer 514 in FIG. 5C has straight nanochannels, and the size (diameter) of the nanoholes may vary from tens of nanometers to one hundred nanometers depending on the anode reaction conditions thereof.

Figure 5D:
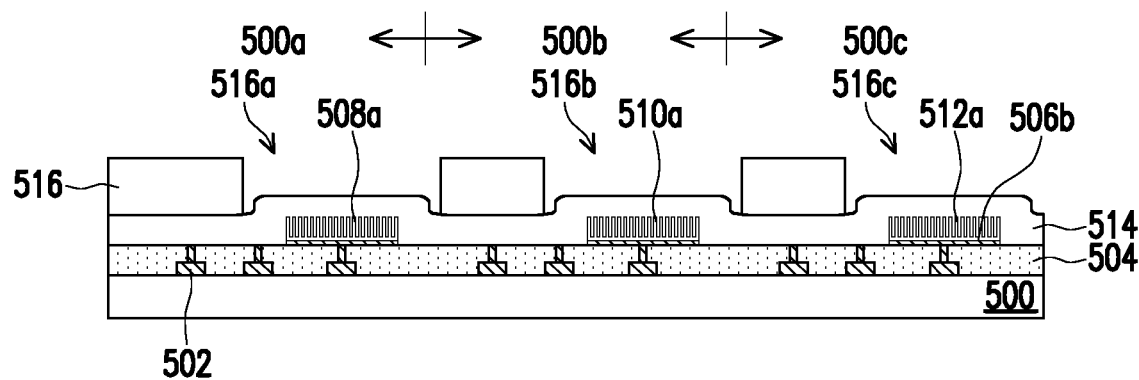

Then, referring to FIG. 5D, the three sensing materials 508, 510, and 512 are different materials from one another, but the photolithography and etching process may be simultaneously performed on the three sensing materials 508, 510, and 512. In FIG. 5D, a patterned photoresist layer 516 is first formed on the AAO layer 514, and openings 516a/516b/516c thereof expose the AAO layer 514 in the regions 500a/500b/500c, and then the AAO layer 514 is used as a mask to simultaneously etch the sensing materials 508/510/512 to form sensing material layers 508a/510a/512a, wherein surfaces thereof have nanoholes, and the size of the nanoholes is close to the size of the nanoholes in the AAO layer 514, such as 100 nm or less.

Since the etching step always adopts the same AAO layer 514 as a mask, the surfaces of the different sensing material layers 508a, 510a, and 512a have nanoholes of similar size, which is advantageous for the quantification of the to-be-detected object.

Figure 5E:
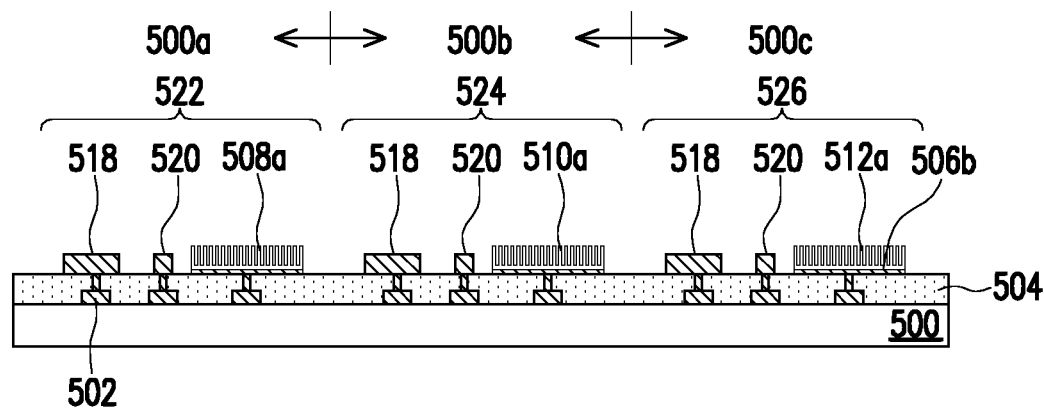

Then, referring to FIG. 5E, the patterned photoresist layer 516 in FIG. 5D is removed first, and then the AAO layer 514 in FIG. 5D is completely removed. Then, related circuits may be separately manufactured according to the sensing principle of the sensors. For example, a plurality of measurement pads (not shown) may be respectively formed on the substrate 500 and a counter electrode 518 and a reference electrode 520 may be respectively formed in the regions 500a, 500b, and 500c using the same thin film process, wherein the thin film process includes a thin film deposition process with a shadow mask, a lift-off process, or a photolithography and etching process after a thin film deposition. Therefore, an independent sensor 522 including the sensing material layer 508a, the counter electrode 518, and the reference electrode 520, an independent sensor 524 including the sensing material layer 510a, the counter electrode 518, and the reference electrode 520, and an independent sensor 526 including the sensing material layer 512a, the counter electrode 518, and the reference electrode 520 may be manufactured. The above independent sensors 522, 524, and 526 are devices performing sensing using cyclic voltammetry measurements, an open-circuit potential method, electrochemical impedance spectroscopy measurements, a TAFEL method, or other suitable electrochemical measurement methods, but the disclosure is not limited thereto.

Figure 5F:
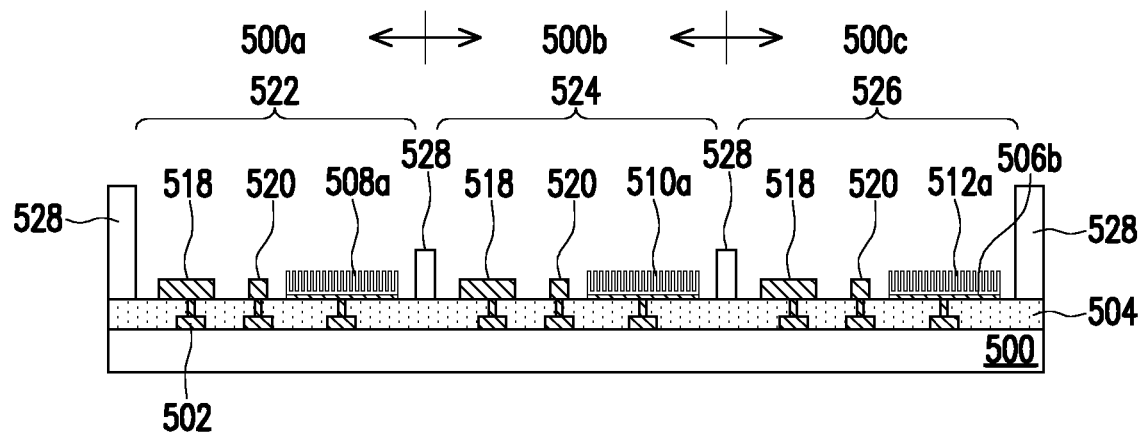

Then, referring to FIG. 5F, partitions 528 are formed on the substrate 500 to separate independent housing spaces according to the regions 500a, 500b, and 500c, wherein the method of forming the partitions 528 is, for example, dispensing, 3D printing, stamping, or screen printing.

The disclosure provides a method of manufacturing a liquid-sensing apparatus that is compatible with a semiconductor process to complete a miniaturized sensing apparatus.

Although the above embodiments are all applied to the sensing of a liquid, the disclosure is not limited thereto, and the disclosure is also applicable to the sensing of a gas. For example, a single layer with multiple sensing materials may be provided, and the type or concentration of the gas is determined by the value of the measured resistance.

Based on the above, in the disclosure, a semiconductor or microelectromechanical process is used to manufacture a plurality of different sensing materials on the same plane of the same substrate and to make different sensing materials have similar nanohole structures using an AAO technique, and therefore quantitation may be achieved by the different sensing material layers having similar reaction areas. As a result, not only is reaction area increased, but the function of distinguishing the type of the to-be-detected object is achieved via the different detection sensitivities (reactions) of the different sensing materials toward different to-be-detected objects.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A liquid-sensing apparatus, comprising:
    a substrate;
    a plurality of partitions disposed on the substrate to separate a plurality of housing spaces for respectively housing a to-be-detected liquid, wherein each of the housing spaces has a bottom, a closed sidewall, and an open top, and the to-be-detected liquid is dripped from the tops of the plurality of housing spaces; and
    a plurality of independent sensors respectively formed at the bottoms of the different housing spaces, wherein the independent sensors respectively comprise different sensing material layers for sensing the to-be-detected liquid dripped thereto, and surfaces of the different sensing material layers have a plurality of nanoholes.

2. The liquid-sensing apparatus of claim 1, wherein each of the independent sensors further comprises a counter electrode and a reference electrode, wherein an area of the counter electrode is greater than an area of the sensing material layer.

3. The liquid-sensing apparatus of claim 2, further comprising:
    a power supply coupled to the counter electrode, the reference electrode, and the sensing material layer;
    an ammeter coupled to the sensing material layer and the counter electrode for measuring a current between the sensing material layer and the counter electrode; and
    a voltmeter coupled to the sensing material layer and the reference electrode for measuring a voltage difference between the sensing material layer and the reference electrode.

4. The liquid-sensing apparatus of claim 1, further comprising:
    an insulating layer disposed between the substrate and the plurality of independent sensors; and
    a plurality of circuit layers disposed in the insulating layer and respectively electrically connected to each of the independent sensors.

5. The liquid-sensing apparatus of claim 1, wherein a size of the nanoholes is 100 nm or less.

6. The liquid-sensing apparatus of claim 1, wherein the independent sensors are arranged in an array, wherein the sensing material layers of the plurality of independent sensors disposed in each row are made of a same material, and the sensing material layers of the plurality of independent sensors disposed in different rows are made of different materials.

7. The liquid-sensing apparatus of claim 1, wherein the sensing material layers of adjacent independent sensors are made of different materials.

8. The liquid-sensing apparatus of claim 1, further comprising a neural network model, wherein a current or voltage signal obtained by the plurality of independent sensors is used as an input, and a type of the to-be-detected liquid is used as an output.

9. A method of manufacturing a liquid-sensing apparatus, comprising:
    providing a substrate;
    forming different sensing materials on different regions of the substrate;
    forming an anodized aluminum oxide (AAO) layer on the substrate to cover the different sensing materials;
    etching the different sensing materials by using the AAO layer as a mask to form different sensing material layers, and surfaces of the different sensing material layers have a plurality of nanoholes;
    removing the AAO layer; and
    forming a plurality of partitions on the substrate to separate independent housing spaces according to the different regions, and each of the sensing material layers is correspondingly disposed in each of the housing spaces.

10. The method of manufacturing the liquid-sensing apparatus of claim 9, further comprising, before forming the different sensing materials:
    forming a plurality of circuit layers on the substrate;
    forming an insulating layer on the substrate to cover the circuit layers;
    forming a plurality of vias connected to the circuit layers in the insulating layer; and
    forming a metal underpad connected to each of the vias and each of the sensing materials on the insulating layer.

11. The method of manufacturing the liquid-sensing apparatus of claim 9, wherein the substrate is an insulating substrate.

12. The method of manufacturing the liquid-sensing apparatus of claim 9, wherein a method of forming the different sensing materials comprises a thin film deposition process with a shadow mask, a lift-off process, or a photolithography and etching process after a thin film deposition.

13. The method of manufacturing the liquid-sensing apparatus of claim 9, wherein a method of etching the different sensing materials comprises: performing a photolithography and etching process on the different sensing materials at the same time according to the different regions.

14. The method of manufacturing the liquid-sensing apparatus of claim 9, further comprising, after removing the AAO layer: forming a plurality of measurement pads on the substrate and forming a reference electrode and a counter electrode in each of the different regions using the same manufacturing process, wherein the manufacturing process comprises a thin film deposition process with a shadow mask, a lift-off process, or a photolithography and etching process after a thin film deposition.

15. The method of manufacturing the liquid-sensing apparatus of claim 9, wherein a method of forming the plurality of partitions comprises dispensing, 3D printing, stamping, or screen printing.

* * * * *